US012610676B2

(12) United States Patent
Chen et al.

(10) Patent No.: US 12,610,676 B2
(45) Date of Patent: Apr. 21, 2026

(54) LIGHT EMITTING DEVICE STRUCTURE AND OPERATION METHOD THEREOF

(71) Applicant: Q-Pixel Inc., Los Angeles, CA (US)

(72) Inventors: Jyh-Chia Chen, Yorba Linda, CA (US); Bruce Conrad Sun, Fremont, CA (US); Michelle Ellen Chen, Palo Alto, CA (US)

(73) Assignee: Q-Pixel Inc., Los Angeles, CA (US)

( * ) Notice: Subject to any disclaimer, the term of this patent is extended or adjusted under 35 U.S.C. 154(b) by 372 days.

(21) Appl. No.: 18/313,379

(22) Filed: May 8, 2023

(65) Prior Publication Data

US 2024/0379921 A1 Nov. 14, 2024

(51) Int. Cl.
*H10H 20/857* (2025.01)
*H10H 20/812* (2025.01)
*H10H 20/825* (2025.01)
*H10H 20/851* (2025.01)

(52) U.S. Cl.
CPC ........ *H10H 20/857* (2025.01); *H10H 20/812* (2025.01); *H10H 20/825* (2025.01); *H10H 20/8514* (2025.01)

(58) Field of Classification Search
CPC .................................................... H10H 20/857
See application file for complete search history.

(56) References Cited

U.S. PATENT DOCUMENTS

| | | | |
|---|---|---|---|
| 2008/0251799 A1 | 10/2008 | Ikezawa | |
| 2009/0272989 A1* | 11/2009 | Shum .................. | H10H 20/813 |
| | | | 257/89 |
| 2010/0045154 A1* | 2/2010 | Kim .......................... | F21K 9/00 |
| | | | 313/1 |
| 2016/0049444 A1* | 2/2016 | Hsu ...................... | H10H 29/142 |
| | | | 257/89 |
| 2018/0277525 A1* | 9/2018 | Cok ....................... | H10H 20/01 |
| 2019/0019839 A1* | 1/2019 | Tian ..................... | H10H 20/835 |
| 2023/0051845 A1 | 2/2023 | Zollner et al. | |
| 2023/0197741 A1* | 6/2023 | Or-Bach ................ | H10H 29/14 |
| | | | 257/79 |

FOREIGN PATENT DOCUMENTS

| | | |
|---|---|---|
| CN | 111525006 | 8/2020 |
| CN | 115295541 | 11/2022 |
| KR | 20120087038 | 8/2012 |
| KR | 20120087039 | 8/2012 |
| KR | 101493354 | 2/2015 |

OTHER PUBLICATIONS

"Office Action of Taiwan Counterpart Application", issued on Jan. 8, 2024, p. 1-p. 12.
"Office Action of Taiwan Counterpart Application", issued on Dec. 4, 2024, p. 1-p. 9.

* cited by examiner

*Primary Examiner* — Brian Turner
(74) *Attorney, Agent, or Firm* — JCIPRNET

(57) ABSTRACT

A light emitting device structure including a first light emitting element and a second light emitting element is provided. The first light emitting element includes a first anode and a first cathode. The second light emitting element is stacked on the first light emitting element and includes a second anode and a second cathode, wherein the second cathode is electrically connected to the first anode. An operation method of the light emitting device structure is also provided.

16 Claims, 9 Drawing Sheets

LIGHT EMITTING DEVICE STRUCTURE AND OPERATION METHOD THEREOF

BACKGROUND

Technical Field

The disclosure relates to a light emitting device structure and an operation method thereof.

Description of Related Art

In a traditional light emitting diode display panel, light emitting diodes of multiple colors are disposed on the same plane as circuits (including driving elements and conductive lines) to implement full-color display. However, as display resolution increases, the spatial pitch between light emitting diodes of multiple colors decreases significantly, and manufacturing challenges arise from increasing circuit density. In addition, disposing the light emitting diodes of multiple colors on the same plane occupies a relatively large area, making it difficult to improve resolution.

SUMMARY

The disclosure provides a light emitting device structure and an operation method thereof, which improves resolution or overcomes manufacturing challenges.

In an embodiment of the disclosure, a light emitting device structure includes a first light emitting element and a second light emitting element. The first light emitting element includes a first anode and a first cathode. The second light emitting element is stacked on the first light emitting element and includes a second anode and a second cathode. The second cathode is electrically connected to the first anode.

In another embodiment of the disclosure, an operation method of a light emitting device structure includes the following steps. A light emitting device structure is provided. The light emitting device structure includes a first light emitting element and a second light emitting element. The first light emitting element includes a first anode and a first cathode. The second light emitting element is stacked on the first light emitting element and includes a second anode and a second cathode. The second cathode is electrically connected to the first anode. A voltage difference between the first anode and the first cathode is enabled to be greater than the first value, so that the first light emitting element emits a first color light. A voltage difference between the second anode and the second cathode is enabled to be greater than the second value, so that the second light emitting element emits a second color light. The second color light and the first color light are different color lights.

In order for the features and advantages of the disclosure to be more comprehensible, the following specific embodiments are described in detail in conjunction with the drawings.

DETAILED DESCRIPTION OF DISCLOSED EMBODIMENTS

Figure 1:
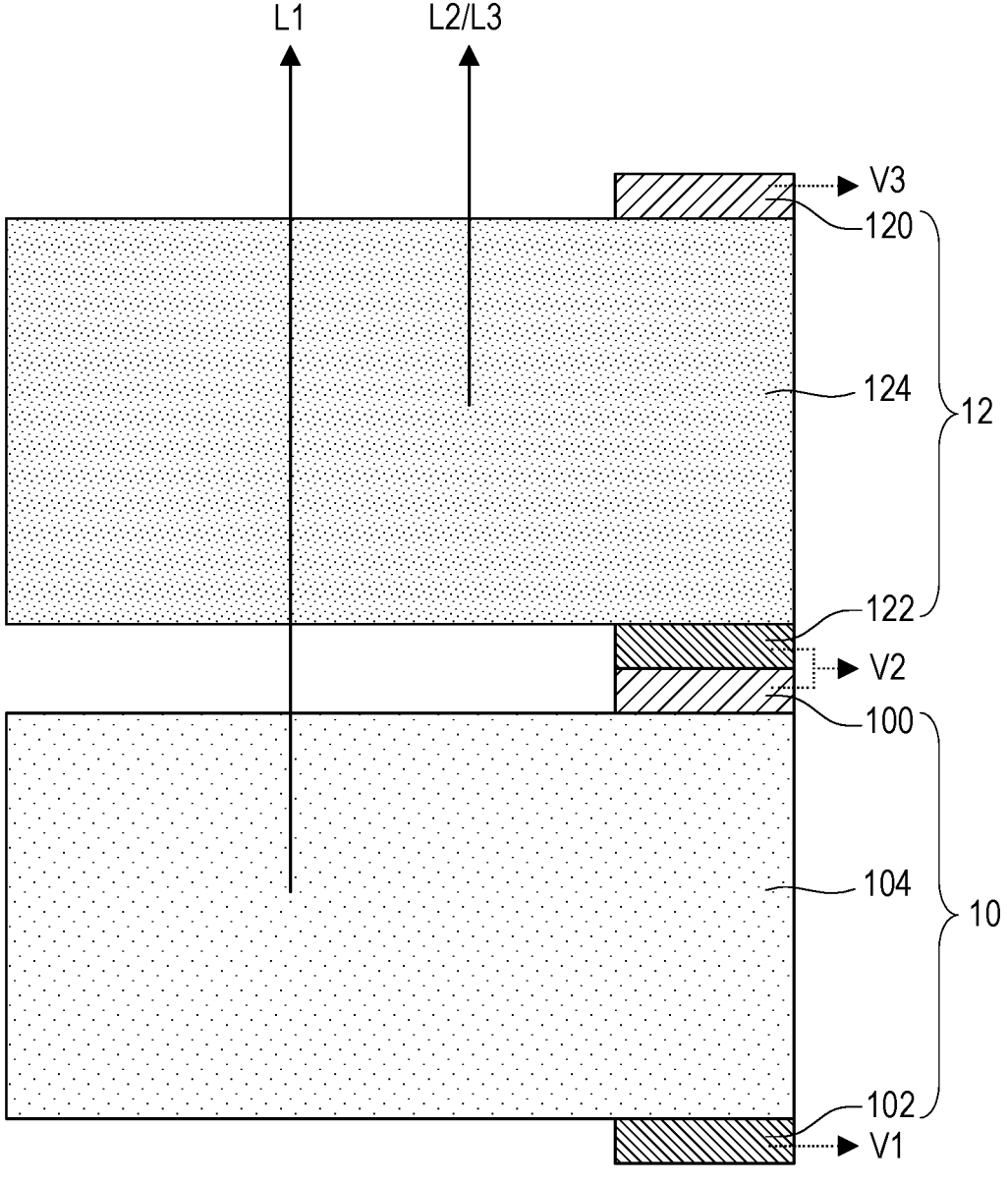
FIG. 1 to FIG. 5, FIG. 7, FIG. 8, and FIG. 10 are schematic views of a light emitting device structure according to multiple embodiments of the disclosure.

Directional terms such as "upper", "lower", "front", "rear", "left", and "right" mentioned in the disclosure are only directions with reference to the drawings. Therefore, the used directional terms are used to illustrate, but not to limit, the disclosure.

In the drawings, each drawing illustrates the general characteristics of a method, a structure, and/or a material used in a specific embodiment. However, the drawings should not be construed to define or limit the scope or nature covered by the embodiments. For example, the relative sizes, thicknesses, and positions of various film layers, regions, and/or structures may be reduced or enlarged for clarity.

In the following embodiments, the same or similar elements will adopt the same or similar reference numerals, and redundant descriptions will be omitted. In addition, features in different embodiments may be combined in the case of no conflict, and simple equivalent changes and modifications made in accordance with the specification, or the claims are still within the scope covered by the patent.

Terms such as "first" and "second" mentioned in the specification or the claims are only used to name different elements or to distinguish different embodiments or ranges and are not used to limit the upper limit or the lower limit of the number of elements, nor used to limit a manufacturing sequence or a setting sequence of elements. Furthermore, an element/a film layer being disposed on (or above) another element/film layer may encompass the case where the element/film layer is directly disposed on (or above) the another element/film layer, and the two elements/film layers are in direct contact; and the case where the element/film layer is indirectly disposed on (or above) the another element/film layer, and there are one or more elements/film layers between the two elements/film layers.

FIG. 1 to FIG. 5, FIG. 7, FIG. 8, and FIG. 10 are schematic views of a light emitting device structure according to multiple embodiments of the disclosure. FIG. 6 is a schematic top view of the light emitting device structure of FIG. 5. FIG. 9 is a schematic top view of the light emitting device structure of FIG. 8.

Please refer to FIG. 1. A light emitting device structure 1 may include a first light emitting element 10 and a second light emitting element 12 stacked on the first light emitting element 10, but not limited thereto. According to different requirements, the light emitting device structure 1 may also include other elements and/or film layers.

Taking a full-color light emitting device structure as an example, the first light emitting element 10 may be a single-color light emitting element, and the second light emitting element 12 may be a double-color light emitting element, but not limited thereto. In other embodiments, the first light emitting element 10 may be a double-color light emitting element, and the second light emitting element 12 may be a single-color light emitting element. The single-color light emitting element may be a red light emitting element, a green light emitting element, or a blue light emitting element. Correspondingly, the double-color light emitting element may be a green-blue light emitting element, a blue-red light emitting element, or a red-green light emitting element. For the convenience of description, the single-color light emitting element is taken as the red light emitting element and the double-color light emitting element is taken as the green-blue light emitting element to continue the description.

The first light emitting element 10 may include a first anode 100 and a first cathode 102. The first anode 100 and the first cathode 102 are made of conductive materials. The conductive material may include a transparent conductive material (for example, metal oxide, graphene, etc.) or a non-transparent conductive material (for example, metal, alloy, etc.). The top view shapes of the first anode 100 and the first cathode 102 are not limited. For example, the top view shape of each of the first anode 100 and the first cathode 102 may be a block, a strip, a sheet, a frame, a ring, or irregular. In addition, the first anode 100 and the first cathode 102 may have the same or different top view shapes.

According to different requirements, the first light emitting element 10 may also include other elements and/or film layers. For example, the first light emitting element 10 may further include a first semiconductor material layer 104, and the first anode 100 and the first cathode 102 are disposed on the first semiconductor material layer 104. In some embodiments, the first light emitting element 10 is, for example, a vertical light emitting diode. As shown of FIG. 1, the first anode 100 and the first cathode 102 may be respectively disposed on the opposite sides of the first semiconductor material layer 104, but the relative setting relationship of the first anode 100, the first cathode 102, and the first semiconductor material layer 104 is not limited thereto.

The material of the first semiconductor material layer 104 may include a GaN-based material or a GaAs-based material, but not limited thereto. In some embodiments, the first semiconductor material layer 104 may include a light emitting layer to emit a first color light L1. Taking the first light emitting element 10 as the red light emitting element and the first color light L1 as red light as an example, the material of the light emitting layer may include an III-V material, such as GaP, AlGaAs, GaAsP, or AlGaInP, but not limited thereto. In some embodiments, the light emitting layer may be a multiple quantum well (MQW) layer, such as an alternate stack of multiple layers of InN and multiple layers of GaN, but not limited thereto.

In some embodiments, although not shown, the first semiconductor material layer 104 may further include one or more of an N-type doped layer, a P-type doped layer, an electron blocking layer, a barrier layer, a compliance layer, and other functional layers. It should be understood that the structure of the first semiconductor material layer 104 may adopt the structure of a semiconductor material layer in a known vertical red light emitting diode, and there is no further limitation here. In addition, a substrate for growing the first semiconductor material layer 104 may include any suitable substrate, and there is no further limitation here.

A range of the first semiconductor material layer 104 covered by the first anode 100 or the first cathode 102 may depend on the light transmittance of an electrode or practical applications (for example, single-side light emission or double-side light emission). If the electrode located on a light emitting side of the first semiconductor material layer 104 is made of a non-transparent conductive material, the electrode may expose a part of the first semiconductor material layer 104 to reduce the shielding of the first color light L1. FIG. 1 schematically shows an implementation of the single-side light emission, wherein the first anode 100 is located on the light emitting side of the first semiconductor material layer 104. If the first anode 100 is made of a non-transparent conductive material, the first anode 100 may expose a part of the first semiconductor material layer 104, that is, the first anode 100 covers only a part of the first semiconductor material layer 104 to reduce the shielding of the first color light L1. On the other hand, when the first anode 100 is made of a transparent conductive material, the first anode 100 may completely cover or partially cover the first semiconductor material layer 104. On the other hand, the light transmittance or the coverage of the first cathode 102 located on a non-light emitting side of the first semiconductor material layer 104 is not limited.

The second light emitting element 12 is disposed on a light emitting side of the first light emitting element 10 and is suitable for allowing the first color light L1 to pass through. The second light emitting element 12 may include a second anode 120 and a second cathode 122, wherein the second cathode 122 is electrically connected to the first anode 100. For example, the second cathode 122 and the first anode 100 may be welded together through direct bonding, such as fusion bonding, but not limited thereto.

The second anode 120 and the second cathode 122 are made of conductive materials. The conductive material may include a transparent conductive material (for example, metal oxide, graphene, etc.) or a non-transparent conductive material (for example, metal, alloy, etc.). The top view shapes of the second anode 120 and the second cathode 122 are not limited. For example, the top view shape of each of the second anode 120 and the second cathode 122 may be a block, a strip, a sheet, a frame, a ring, or irregular. In addition, the second anode 120 and the second cathode 122 may have the same or different top view shapes.

According to different requirements, the second light emitting element 12 may also include other elements and/or film layers. For example, the second light emitting element 12 may further include a second semiconductor material layer 124, and the second anode 120 and the second cathode 122 are disposed on the second semiconductor material layer 124. In some embodiments, the second light emitting element 12 is, for example, a vertical light emitting diode. As shown of FIG. 1, the second anode 120 and the second cathode 122 may be respectively disposed on the opposite sides of the second semiconductor material layer 124, but the relative setting relationship of the second anode 120, the second cathode 122, and the second semiconductor material layer 124 is not limited thereto.

The second semiconductor material layer 124 may include two light emitting layers, and the two light emitting layers respectively emit a second color light L2 and a third color light L3. Taking the second light emitting element 12 as the green-blue light emitting element, the second color light L2 as green light, and the third color light L3 as blue light as an example, the materials of the two light emitting layers may include III-V materials, such as GaP, SiC, ZnCdSe, or GaN, but not limited thereto. In some embodiments, the two light emitting layers may be multiple quantum well layers, wherein a green light emitting layer is, for example, an alternate stack of multiple layers of InGaN (for example, $In_{0.25}Ga_{0.75}N$) and multiple layers of GaN, but not limited thereto; and a blue light emitting layer is, for example, an alternate stack of multiple layers of InGaN (for example, $In_{0.15}Ga_{0.85}N$) and multiple layers of GaN, but not limited thereto.

In some embodiments, although not shown, the second semiconductor material layer 124 may further include one or more of an N-type doped layer, a P-type doped layer, an electron blocking layer, a barrier layer, a compliance layer, and other functional layers. It should be understood that the structure of the second semiconductor material layer 124 may adopt the structure of a semiconductor material layer in a known vertical green-blue light emitting diode, and there is no further limitation here. In addition, a substrate for growing the second semiconductor material layer 124 may include any suitable substrate, and there is no further limitation here.

A range of the second semiconductor material layer 124 covered by the second anode 120 or the second cathode 122 may depend on the light transmittance of an electrode or practical applications (for example, single-side light emission or double-side light emission). In the embodiment, the second light emitting element 12 is disposed on the light emitting side of the first light emitting element 10. If the second cathode 122 is made of a non-transparent conductive material, the second cathode 122 may expose a part of the second semiconductor material layer 124, that is, the second cathode 122 covers only a part of the second semiconductor material layer 124 to reduce the shielding of the first color light L1. In addition, the second anode 120 may expose a part of the second semiconductor material layer 124, that is, the second anode 120 covers only a part of the second semiconductor material layer 124 to reduce the shielding of the first color light L1, the second color light L2, and/or the third color light L3. On the other hand, when the second anode 120 and the second cathode 122 are made of transparent conductive materials, the second anode 120 and the second cathode 122 may completely cover or partially cover the second semiconductor material layer 124. Furthermore, when the second cathode 122 and the first anode 100 are fixed together by adopting direct bonding, the second cathode 122 and the first anode 100 may have the same top view shapes and areas.

An operation method of the light emitting device structure 1 may include the following steps. The light emitting device structure 1 is provided. A voltage difference (for example, a voltage V2 minus a voltage V1) between the first anode 100 and the first cathode 102 is enabled to be greater than a first value, so that the first light emitting element 10 emits the first color light L1. A voltage difference between the second anode 120 and the second cathode 122 (for example, a voltage V3 minus a voltage V2) is enabled to be greater than a second value, so that the second light emitting element 12 emits the second color light L2, wherein the second color light L2 and the first color light L1 are different color lights.

In an embodiment where the first light emitting element 10 is the single-color light emitting element and the second light emitting element 12 is the double-color light emitting element, the operation method of the light emitting device structure 1 may further include enabling the voltage difference (for example, the voltage V3 minus the voltage V2) between the second anode 120 and the second cathode 122 to be greater than a third value, so that the second light emitting element 12 emits the third color light L3, wherein the third value is different from the second value, and the third color light L3, the second color light L2, and the first color light L1 are different color lights. For example, in an embodiment where the first light emitting element 10 is the red light emitting element and the second light emitting element 12 is the green-blue light emitting element, the first color light L1 is red light, the second color light L2 is green light, and the third color light L3 is blue light.

Each of the first value to the third value varies depending on factors such as selected materials and process parameters. For example, in an embodiment where the first semiconductor material layer 104 adopts a GaAs-based material, the first value is, for example, 2 volts (V), that is, when the voltage difference between the first anode 100 and the first cathode 102 is greater than 2 volts, the first light emitting element 10 emits the first color light L1. On the other hand, in an embodiment where the first semiconductor material layer 104 adopts a GaN-based material, the first value is, for example, 3 volts, that is, when the voltage difference between the first anode 100 and the first cathode 102 is greater than 3 volts, the first light emitting element 10 emits the first color light L1. In addition, the second value is, for example, 3 volts, and the third value is, for example, 4 volts. That is, when the voltage difference between the second anode 120 and the second cathode 122 is greater than 3 volts, the second light emitting element 12 emits the second color light L2, and when the voltage difference between the second anode 120 and the second cathode 122 is greater than 4 volts, the second light emitting element 12 emits the third color light L3. It should be understood that the first value to the third value are only exemplary and are not intended to limit the disclosure.

In some embodiments, the second cathode 122 and the first anode 100 may be grounded (that is, the voltage V2 is 0). Under such architecture, the voltage V1 may be set to −2 volts or −3 volts to light the first light emitting element 10 (enable the first light emitting element 10 to emit the first color light L1), and the voltage V3 may be set to 3 volts or 4 volts to light the second light emitting element 12 (enable the second light emitting element 12 to emit the second color light L2 or the third color light L3).

In some other embodiments, the first cathode 102 may be grounded (that is, the voltage V1 is 0). Under such architecture, the voltage V2 may be set to 2 volts or 3 volts to light the first light emitting element 10 (for example, enable the first light emitting element 10 to emit the first color light L1).

Compared with integrating light emitting layers of three colors into the same light emitting diode, independently forming the first light emitting element 10 and the second light emitting element 12, and then stacking the two together to form the light emitting device structure 1 can help to increase the brightness of color light (for example, red light), reduce process difficulty, or improve yield. In addition, compared with disposing light emitting diodes of multiple colors on the same plane, adopting the vertically stacked light emitting device structure 1 can occupy a smaller area, which helps to improve resolution. In addition, electrically connecting the second cathode 122 of the second light emitting element 12 to the first anode 100 of the first light emitting element 10 can help to reduce the number of pins of the light emitting device structure 1 and the corresponding number of external conductive lines, thereby helping to improve the flexibility of circuit layout, simplify the process, reduce the space occupied by the circuit, or improve resolution.

Figure 2:
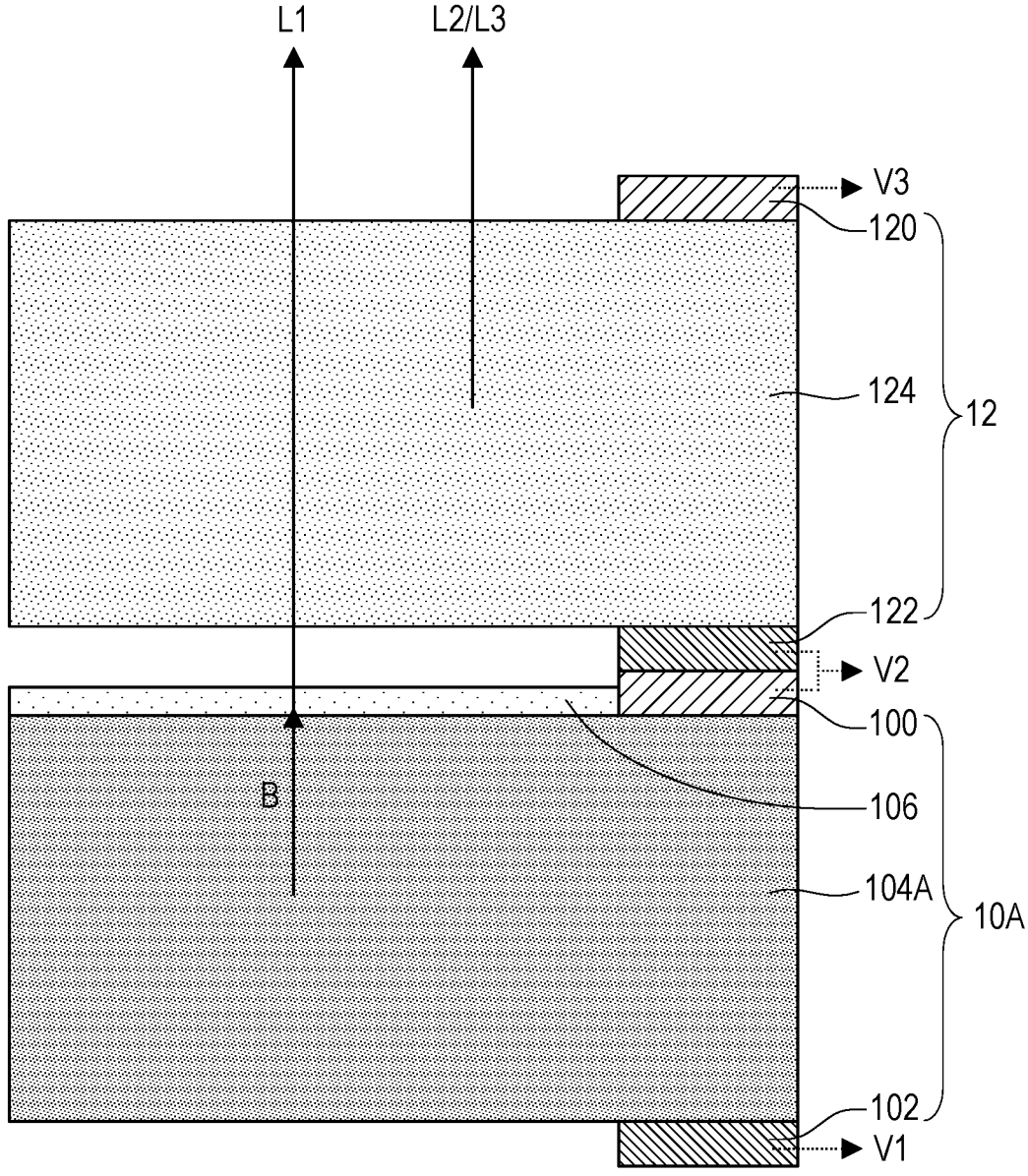

Please refer to FIG. 2. The main difference between a light emitting device structure 1A and the light emitting device structure 1 of FIG. 1 is described as follows. In the light emitting device structure 1A, a single-color light emitting element (for example, the first light emitting element 10) is, for example, a combination of a blue light emitting element and a red wavelength conversion layer 106.

In detail, the first light emitting element 10A includes the first anode 100, the first cathode 102, a first semiconductor material layer 104A, and the red wavelength conversion layer 106, wherein the blue light emitting element is mainly composed of the first anode 100, the first cathode 102, and the first semiconductor material layer 104A, and the first semiconductor material layer 104A includes a blue light emitting layer to output a blue light B.

The blue light B is converted into the first color light L1 by the red wavelength conversion layer 106. The first semiconductor material layer 104A may adopt the structure of a semiconductor material layer in a known vertical blue light emitting diode, and there is no further limitation here. The material of the red wavelength conversion layer 106 may include red quantum dots, red phosphors, a rare earth material, or other red materials. Furthermore, the red wavelength conversion layer 106 may be in the form of particles, gel, a film, or a plate.

Under the architecture that the first light emitting element 10A is a combination of the blue light emitting element and the red wavelength conversion layer, and the second light emitting element 12 is the green-blue light emitting element, the first value and the third value may be the same (for example, both 4 volts). Specifically, the voltage difference (for example, the voltage V2 minus the voltage V1) between the first anode 100 and the first cathode 102 may be enabled to be greater than 4 volts, so that the first semiconductor material layer 104A emits the blue light B, and the blue light B is converted into the first color light L1 by the red wavelength conversion layer 106 and is output from the first light emitting element 10A. Under the architecture that the second cathode 122 and the first anode 100 are grounded, the voltage V1 is, for example, −4 volts. Under the architecture that the first cathode 102 is grounded, the voltage V2 is, for example, 4 volts.

In some embodiments, although not shown in FIG. 2, the first light emitting element 10A may adopt the green-blue light emitting element, the first light emitting element 10A may emit the blue light B through modulating the voltage difference, and the blue light B is then converted into the first color light L1 through the red wavelength conversion layer 106.

Figure 3:
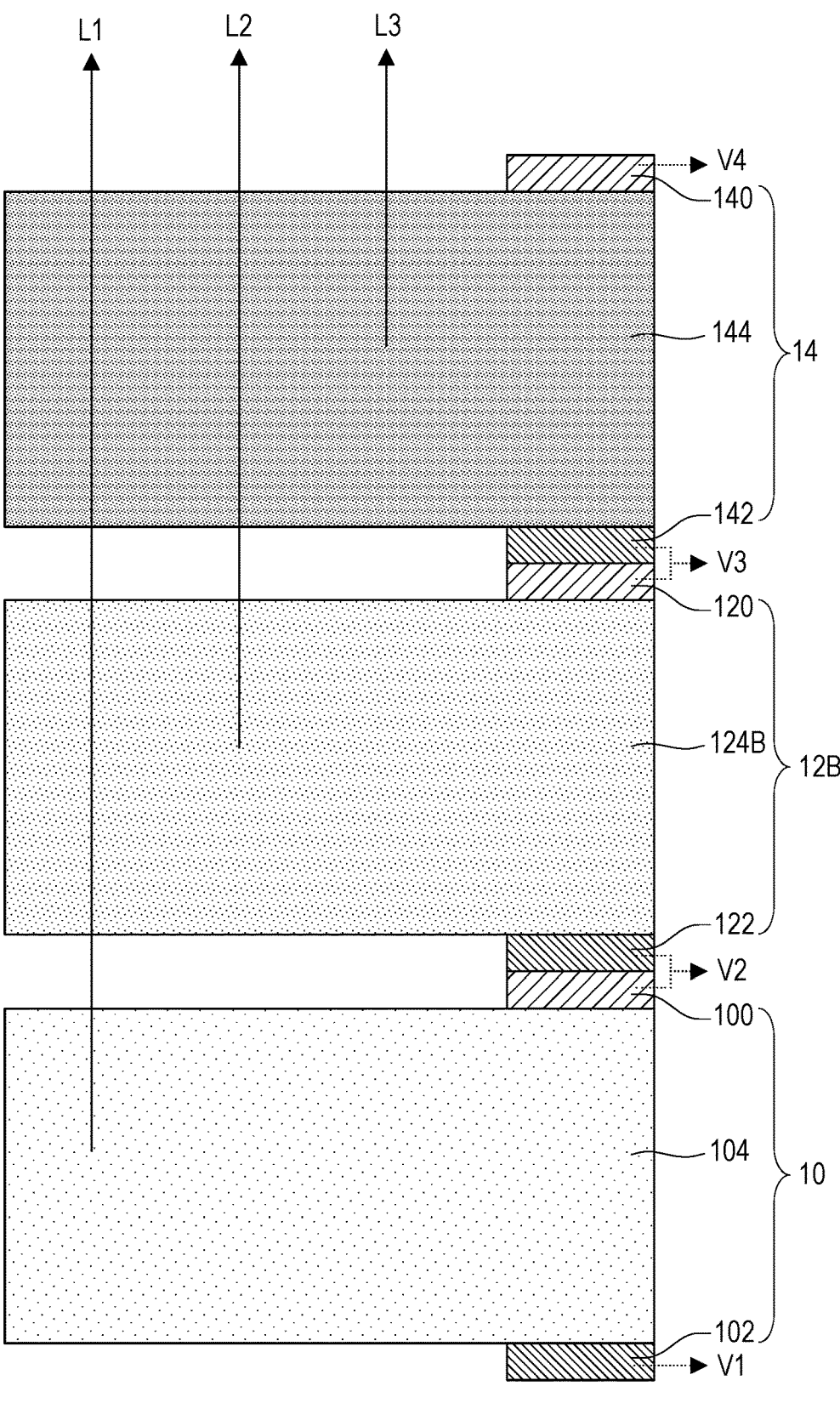

Please refer to FIG. 3. The main difference between a light emitting device structure 1B and the light emitting device structure 1 of FIG. 1 is described as follows. The light emitting device structure 1B also includes a third light emitting element 14. The third light emitting element 14 is stacked on the second light emitting element 12 and is suitable for allowing the first color light L1 and the second color light L2 to pass through. The third light emitting element 14 includes a third anode 140 and a third cathode 142, wherein the third cathode 142 is electrically connected to the second anode 120. For example, under the architecture that the third light emitting element 14 is a vertical light emitting diode, the third cathode 142 and the second anode 120 may be welded together through fusion bonding, but not limited thereto.

The first light emitting element 10, the second light emitting element 12B, and the third light emitting element 14 may all be single-color light emitting elements. For example, the first light emitting element 10 is a red light emitting element, the second light emitting element 12B is a green light emitting element, and the third light emitting element 14 is a blue light emitting element, but not limited thereto. The first semiconductor material layer 104 in the first light emitting element 10 includes a red light emitting layer to output red light (the first color light L1), a second semiconductor material layer 124B in the second light emitting element 12B includes a green light emitting layer to output green light (the second color light L2), and a third semiconductor material layer 144 in the third light emitting element 14 includes a blue light emitting layer to output blue light (the third color light L3).

In some embodiments, although not shown, each of the first semiconductor material layer 104, the second semiconductor material layer 124B, and the third semiconductor material layer 144 may further include one or more of an N-type doped layer, a P-type doped layer, an electron blocking layer, a barrier layer, a compliance layer, and other functional layers. It should be understood that the structures of the first semiconductor material layer 104, the second semiconductor material layer 124B, and the third semiconductor material layer 144 may respectively adopt the structure of a semiconductor material layer in a known vertical red light emitting diode, vertical green light emitting diode, and vertical blue light emitting diode, and there is no further limitation here. In addition, substrates for growing the first semiconductor material layer 104, the second semiconductor material layer 124B, and the third semiconductor material layer 144 may include any suitable substrates, and there is no further limitation here.

Through independently forming the light emitting diodes of the three colors and then stacking the light emitting diodes of the three color together, the voltage difference (for example, the voltage V2 minus the voltage V1) between the first anode 100 and the first cathode 102 may be enabled to be greater than the first value (for example, 2 volts or 3 volts), so that the first light emitting element 10 emits the first color light L1; the voltage difference (for example, the voltage V3 minus the voltage V2) between the second anode 120 and the second cathode 122 may be enabled to be greater than the second value (for example, 3 volts), so that the second light emitting element 12B emits the second color light L2; and the voltage difference (for example, a voltage V4 minus the voltage V3) between the third anode 140 and the third cathode 142 may be enabled to be greater than the third value (for example, 4 volts), so that the third light emitting element 14 emits the third color light L3. The first value may be different from the third value, and the second value may be different from the third value, but not limited thereto.

Compared with integrating the light emitting layers of three colors into the same light emitting diode, independently forming the light emitting elements of different colors (for example, the first light emitting element 10, the second light emitting element 12B, and the third light emitting element 14), and then stacking the light emitting elements of different colors together to form the light emitting device structure 1B can help to increase the brightness of each color light, reduce process difficulty, or improve yield. In addition, compared with disposing light emitting diodes of multiple colors on the same plane, adopting the vertically stacked light emitting device structure 1B can occupy a smaller area, which helps to improve resolution. In addition, connecting the light emitting elements of different colors together in series can help to reduce the number of pins of the light emitting device structure 1B and the corresponding number of external conductive lines, thereby helping to improve the flexibility of circuit layout, simplify the process, reduce the space occupied by the circuit, or improve resolution.

Figure 4:
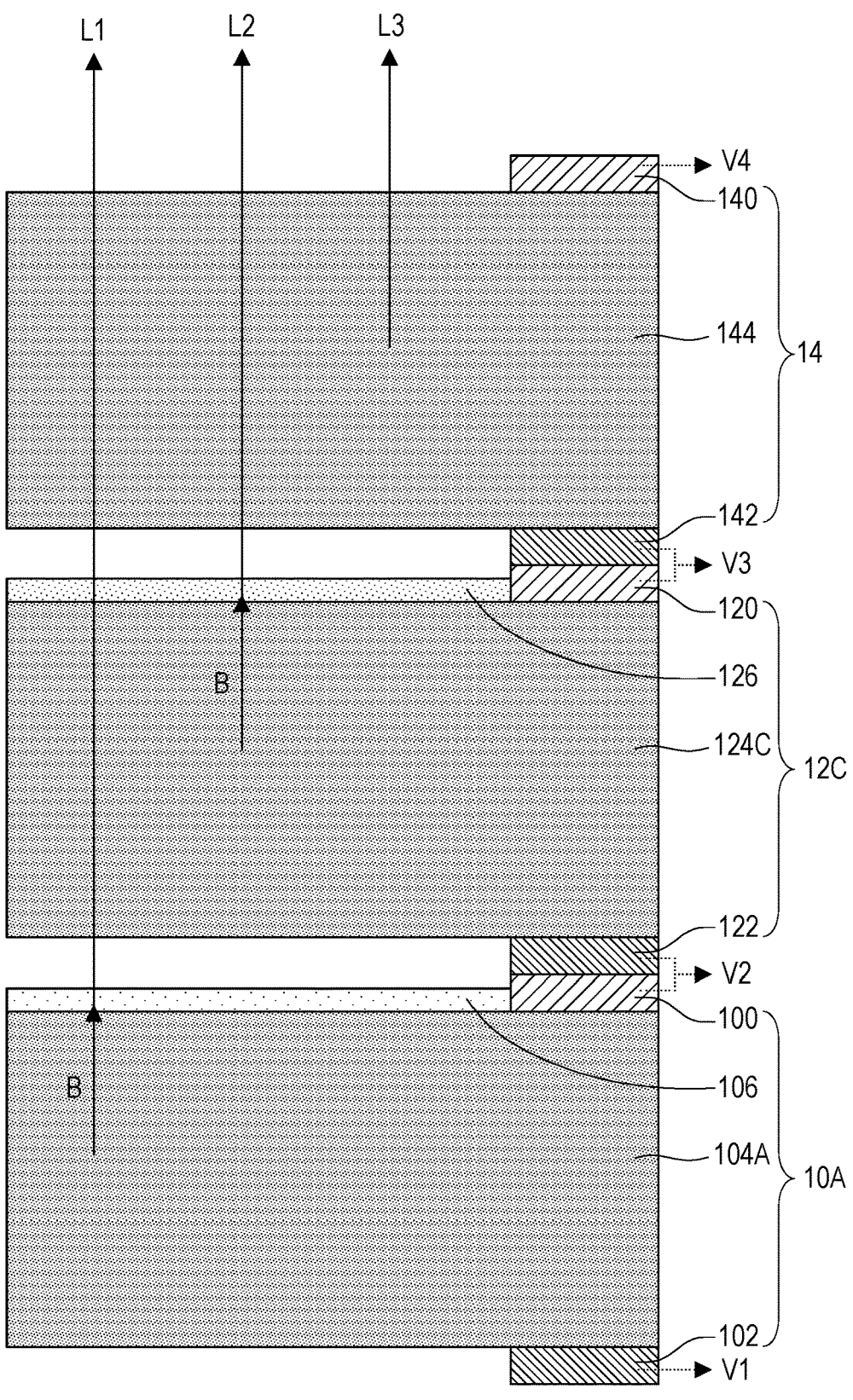

Please refer to FIG. 4. The main difference between a light emitting device structure 1C and the light emitting device structure 1B of FIG. 3 is described as follows. In the light emitting device structure 1C, the first light emitting element 10A is a combination of a blue light emitting element and a red wavelength conversion layer, and a second light emitting element 12C is a combination of a blue light emitting element and a green wavelength conversion layer.

In detail, the first light emitting element 10A includes the first anode 100, the first cathode 102, the first semiconductor material layer 104A, and the red wavelength conversion layer 106, wherein the blue light emitting element is mainly composed of the first anode 100, the first cathode 102, and the first semiconductor material layer 104A, and the first semiconductor material layer 104A includes a blue light emitting layer to output the blue light B. The blue light B is converted into the first color light L1 by the red wavelength conversion layer 106.

The second light emitting element 12C includes the second anode 120, the second cathode 122, the second semiconductor material layer 124C, and a green wavelength conversion layer 126, wherein the blue light emitting element is mainly composed of the second anode 120, the second cathode 122, and the second semiconductor material layer 124C, and the second semiconductor material layer 124C includes a blue light emitting layer to output the blue light B. The blue light B is converted into the second color light L2 by the green wavelength conversion layer 126. The first semiconductor material layer 104A and the second semiconductor material layer 124C may adopt the structure of a semiconductor material layer in a known vertical blue light emitting diode, and there is no further limitation here.

The material of the red wavelength conversion layer 106 may include red quantum dots, red phosphors, a rare earth material, or other red materials. Furthermore, the red wavelength conversion layer 106 may be in the form of particles, gel, a film, or a plate. The material of the green wavelength conversion layer 126 may include green quantum dots, green phosphors, a rare earth material, or other green materials. Furthermore, the green wavelength conversion layer 126 may be in the form of particles, gel, a film, or a plate.

Under the architecture that the first light emitting element 10A is the combination of the blue light emitting element and the red wavelength conversion layer, the second light emitting element 12C is the combination of the blue light emitting element and the green wavelength conversion layer, and the third light emitting element 14 is the blue light emitting element, the first value, the second value, and the third value may be the same (for example, all 4 volts). Specifically, the voltage difference (for example, the voltage V2 minus the voltage V1) between the first anode 100 and the first cathode 102 may be enabled to be greater than 4 volts, so that the first semiconductor material layer 104A emits the blue light B, and the blue light B is converted into the first color light L1 by the red wavelength conversion layer 106 and is output from the first light emitting element 10A. The voltage difference (for example, the voltage V3 minus the voltage V2) between the second anode 120 and the second cathode 122 may be enabled to be greater than 4 volts, so that the second semiconductor material layer 104C emits the blue light B, and the blue light B is converted into the second color light L2 by the green wavelength conversion layer 126 and is output from the second light emitting element 12C. The voltage difference (for example, the voltage V4 minus the voltage V3) between the third anode 140 and the third cathode 142 may be enabled to be greater than 4 volts, so that the third semiconductor material layer 144 emits the third color light L3.

Figure 5:
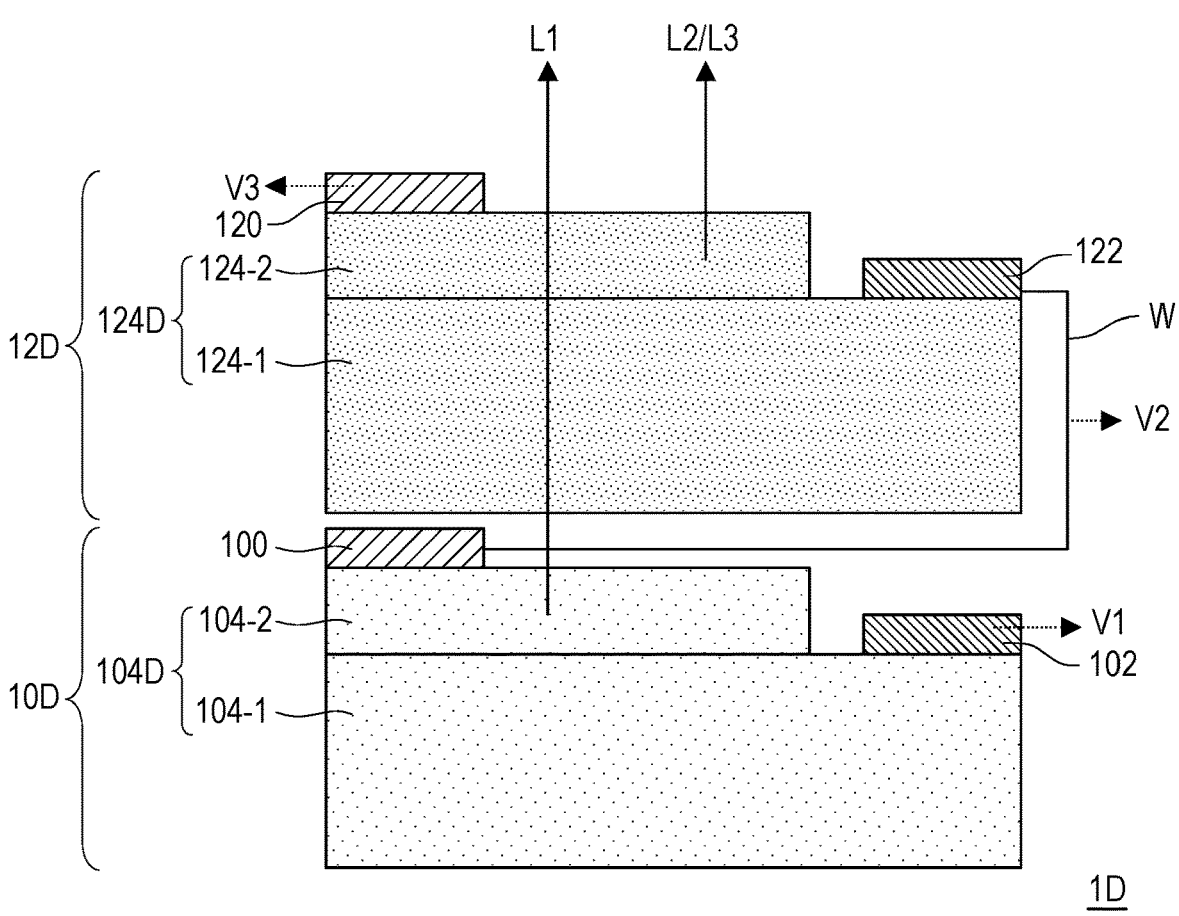
Figure 6:
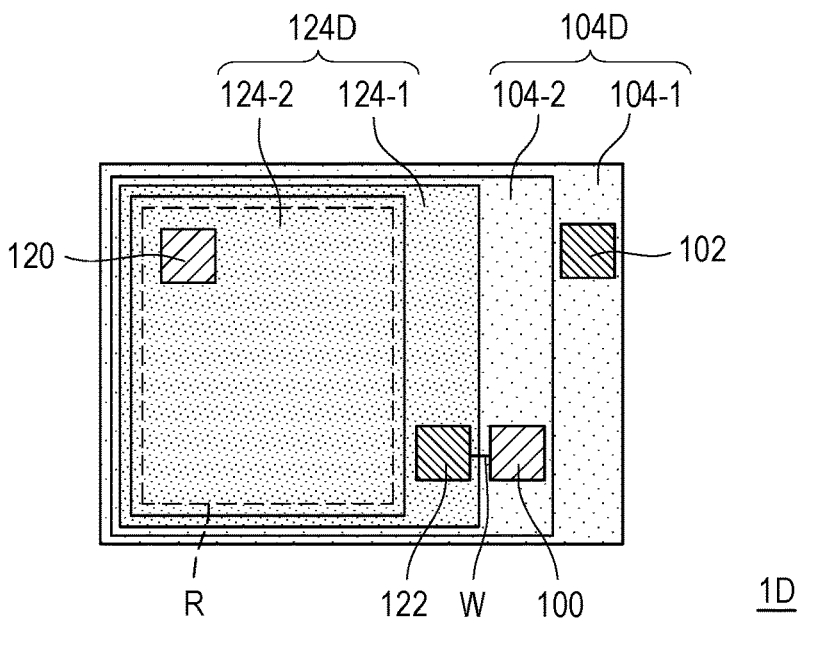
FIG. 6 is a schematic top view of the light emitting device structure of FIG. 5.

Please refer to FIG. 5. The main difference between a light emitting device structure 1D and the light emitting device structure 1 of FIG. 1 is that a first light emitting element 10D and a second light emitting element 12D in the light emitting device structure 1D are both lateral light emitting diodes, wherein the first anode 100 and the first cathode 102 are disposed on the same side (for example, a light emitting side) of the first semiconductor material layer 104D, and the second anode 120 and the second cathode 122 are disposed on the same side (for example, a light emitting side) of the second semiconductor material layer 124D.

The first semiconductor material layer 104D may include a platform portion 104-1 and a convex portion 104-2. Although not shown in FIG. 5, the platform portion 104-1 may include a substrate, a buffer layer, and an N-type doped layer, but not limited thereto. The buffer layer and the N-type doped layer are sequentially stacked on the substrate. The convex portion 104-2 and the first cathode 102 are disposed on the N-type doped layer of the platform portion 104-1 and are separated from each other. The convex portion 104-2 may include a compliance layer, a light emitting layer (for example, a red light emitting layer), an electron blocking layer, and a P-type doped layer sequentially stacked on the platform portion 104-1, but not limited thereto. The first anode 100 is disposed on the convex portion 104-2.

The second semiconductor material layer 124D may include a platform portion 124-1 and a convex portion 124-2. Although not shown in FIG. 5, the platform portion 124-1 may include a substrate, a buffer layer, and an N-type doped layer, but not limited thereto. The buffer layer and the N-type doped layer are sequentially stacked on the substrate. The convex portion 124-2 and the second cathode 122 are disposed on the N-type doped layer of the platform portion 124-1 and are separated from each other. The convex portion 124-2 may include a compliance layer, a blue light emitting layer (or a green light emitting layer), a barrier layer, a green light emitting layer (or a blue light emitting layer), an electron blocking layer, and a P-type doped layer, but not limited thereto. The second anode 120 is disposed on the convex portion 124-2.

It should be understood that the number and/or the stacking order of film layers in the first semiconductor material layer 104D or the second semiconductor material layer 124D may be changed according to actual requirements and are not limited to the above examples.

Under the architecture that the first light emitting element 10D and the second light emitting element 12D are both lateral light emitting diodes, the second light emitting element 12D may be fixed onto the first light emitting element 10D through a light transmitting adhesive layer (not shown) or other fixing elements (not shown). In addition, the second cathode 122 and the first anode 100 may be electrically connected through a conductive line W. FIG. 5 schematically shows the conductive line W for electrically connecting the second cathode 122 to the first anode 100, but the actual setting manner of the conductive line W may be changed according to actual requirements.

FIG. 6 schematically shows one of the setting manners of the conductive line W. Please refer to FIG. 6. In some embodiments, the top view area of the first semiconductor material layer 104D may be greater than the top view area of the second semiconductor material layer 124D, and the conductive line W may be disposed on the first semiconductor material layer 104D and the second semiconductor material layer 124D, and is electrically insulated from the first cathode 102 and the second anode 120.

For example, the top view area of the platform portion 104-1 of the first semiconductor material layer 104D may be greater than the top view area of the convex portion 104-2 of the first semiconductor material layer 104D, the top view area of the convex portion 104-2 of the first semiconductor material layer 104D may be greater than the top view area of the platform portion 124-1 of the second semiconductor material layer 124D, and the top view area of the platform portion 124-1 of the second semiconductor material layer 124D may be greater than the top view area of the convex portion 124-2 of the second semiconductor material layer 124D. The conductive line W may be disposed on the platform portion 124-1 of the second semiconductor material layer 124D and the convex portion 104-2 of the first semiconductor material layer 104D, and electrically connects the second cathode 122 to the first anode 100.

Through the aforementioned control of the voltage difference (please refer to the operation method of the light emitting device structure 1 in FIG. 1), a light emitting region R of the light emitting device structure 1D may also perform full-color display (for example, may output red light, green light, and/or blue light). Reference may be made to the function of the light emitting device structure 1 in FIG. 1 for the function of the light emitting device structure 1D, which will not be repeated here.

Figure 7:
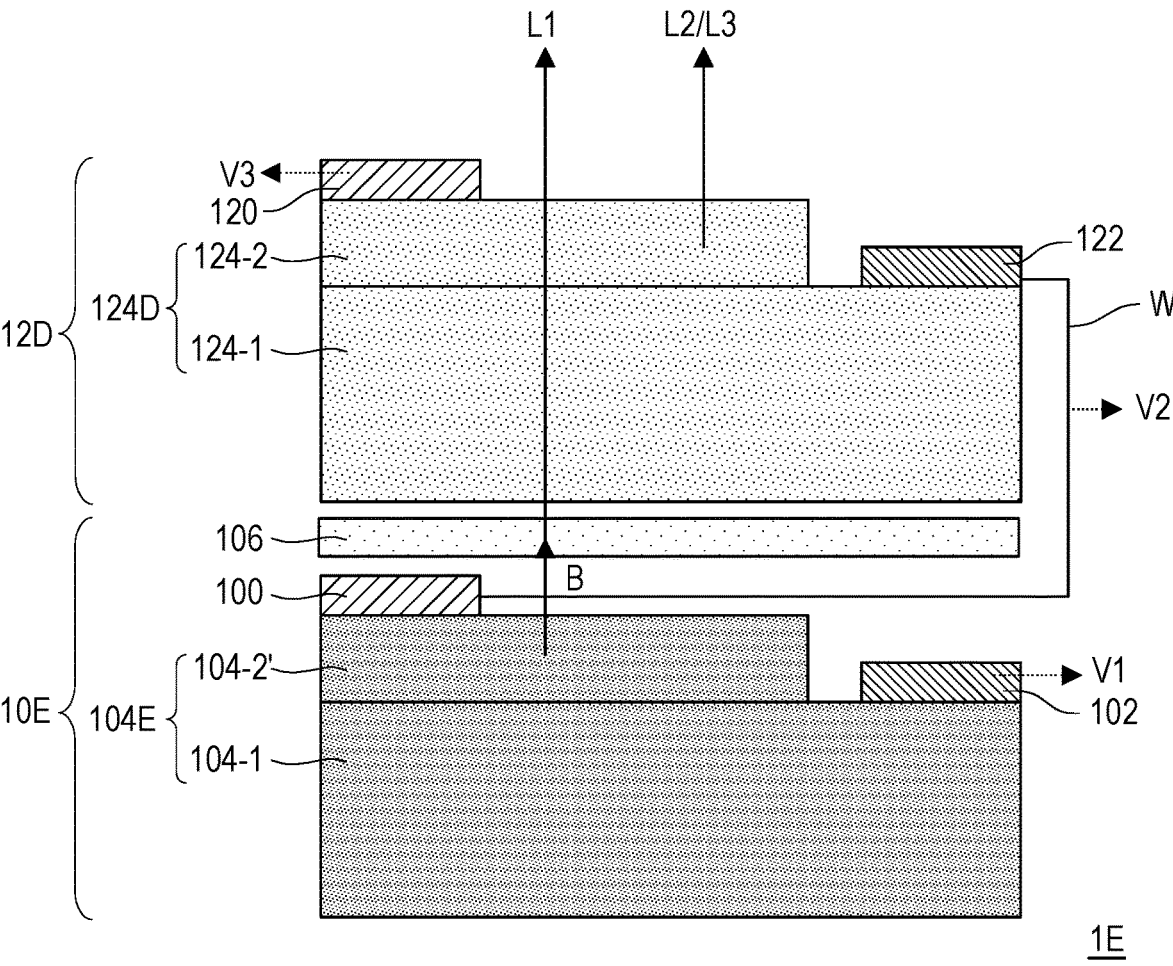

Please refer to FIG. 7. The main difference between a light emitting device structure 1E and the light emitting device structure 1A of FIG. 2 is that a first light emitting element 10E and the second light emitting element 12D in the light emitting device structure 1E are both lateral light emitting diodes, wherein the first anode 100 and the first cathode 102 are disposed on the same side (for example, a light emitting side) of a first semiconductor material layer 104E, and the second anode 120 and the second cathode 122 are disposed on the same side (for example, the light emitting side) of the second semiconductor material layer 124D.

The main difference between the first light emitting element 10E and the first light emitting element 10D in FIG. 5 is that the first light emitting element 10E is a combination of a blue light emitting element (including the first anode 100, the first cathode 102, and the first semiconductor material layer 104E) and the red wavelength conversion layer 106. The first semiconductor material layer 104E includes the platform portion 104-1 and a convex portion 104-2'. Although not shown in FIG. 7, the platform portion 104-1 may include a substrate, a buffer layer, and an N-type doped layer, but not limited thereto. The buffer layer and the N-type doped layer are sequentially stacked on the substrate. The convex portion 104-2' and the first cathode 102 are disposed on the N-type doped layer of the platform portion 104-1 and are separated from each other. The convex portion 104-2' may include a compliance layer, a light emitting layer (for example, a blue light emitting layer), an electron blocking layer, and a P-type doped layer sequentially stacked on the platform portion 104-1, but not limited thereto. The first anode 100 is disposed on the convex portion 104-2'. The blue light B output by the blue light emitting layer is converted into the first color light L1 by the red wavelength conversion layer 106 and is then output from the first light emitting element 10E.

Reference may be made to the operation method of the light emitting device structure 1A in FIG. 2 for the operation method of the light emitting device structure 1E, which will not be repeated here.

In some embodiments, although not shown in FIG. 7, the first light emitting element 10E may adopt the green-blue light emitting element (for example, replace the first semiconductor material layer 104E with the second semiconductor material layer 124D), the first light emitting element 10A may emit the blue light B through modulating the voltage difference, and the blue light B is then converted into the first color light L1 through the red wavelength conversion layer 106.

Figure 8:
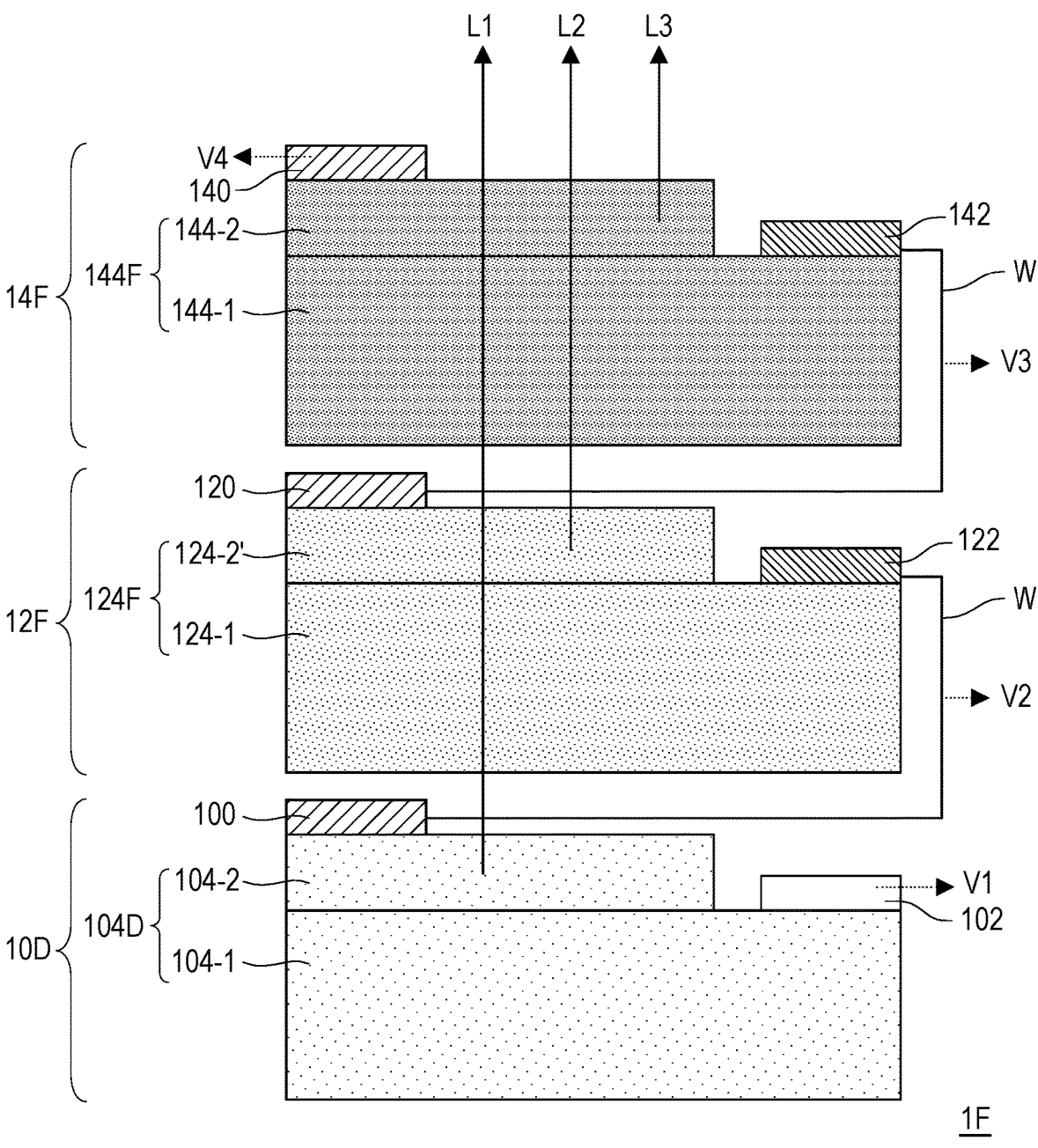
Figure 9:
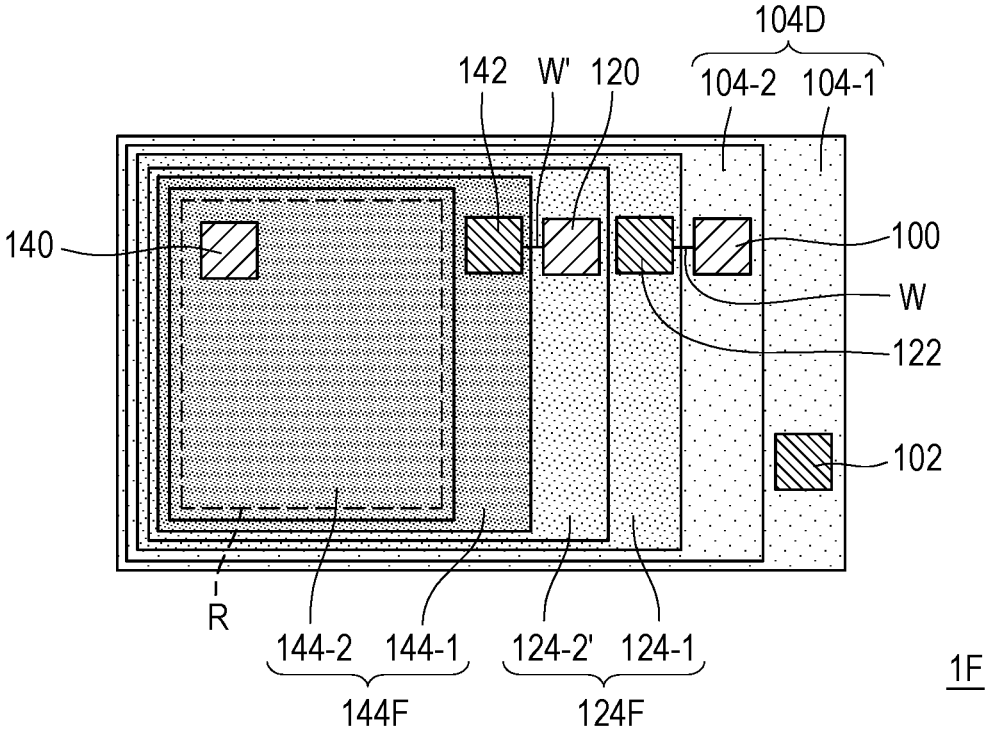
FIG. 9 is a schematic top view of the light emitting device structure of FIG. 8.

Please refer to FIG. 8. The main difference between a light emitting device structure 1F and the light emitting device structure 1B of FIG. 3 is that the first light emitting element 10D, a second light emitting element 12F, and a third light emitting element 14F in the light emitting device structure 1E are all lateral light emitting diodes, wherein the first anode 100 and the first cathode 102 are disposed on the same side (for example, the light emitting side) of the first semiconductor material layer 104D, the second anode 120 and the second cathode 122 are disposed on the same side (for example, a light emitting side) of a second semiconductor material layer 124F, and the third anode 140 and the third cathode 142 are disposed on the same side (for example, a light emitting side) of a third semiconductor material layer 144F.

The second semiconductor material layer 124F may include the platform portion 124-1 and a convex portion 124-2'. Although not shown in FIG. 8, the platform portion 124-1 may include a substrate, a buffer layer, and an N-type doped layer, but not limited thereto. The buffer layer and the N-type doped layer are sequentially stacked on the substrate. The convex portion 124-2' and the second cathode 122 are disposed on the N-type doped layer of the platform portion 124-1 and are separated from each other. The convex portion 124-2' may include a compliance layer, a green light emitting layer, an electron blocking layer, and a P-type doped layer sequentially stacked on the platform portion 124-1, but not limited thereto. The second anode 120 is disposed on the convex portion 124-2'.

The third semiconductor material layer 144F may include a platform portion 144-1 and a convex portion 144-2. Although not shown in FIG. 8, the platform portion 144-1 may include a substrate, a buffer layer, and an N-type doped layer, but not limited thereto. The buffer layer and the N-type doped layer are sequentially stacked on the substrate. The convex portion 144-2 and the second cathode 142 are disposed on the N-type doped layer of the platform portion 144-1 and are separated from each other. The convex portion 144-2 may include a compliance layer, a blue light emitting layer, an electron blocking layer, and a P-type doped layer sequentially stacked on the platform portion 124-1, but not limited thereto. The second anode 140 is disposed on the convex portion 144-2.

Reference may be made to the operation method of the light emitting device structure 1B in FIG. 3 for the operation method of the light emitting device structure 1F, which will not be repeated here.

Under the architecture that the first light emitting element 10D, the second light emitting element 12F, and the third light emitting element 14F are all lateral light emitting diodes, the second light emitting element 12F may be fixed onto the first light emitting element 10D through a light transmitting adhesive layer (not shown) or other fixing elements (not shown), and the third light emitting element 14F may be fixed onto the second light emitting element 12F through a light transmitting adhesive layer (not shown) or other fixing elements (not shown). In addition, the second cathode 122 and the first anode 100 may be electrically connected through the conductive line W, and the second cathode 142 and the second anode 120 may be electrically connected through a conductive line W'. FIG. 8 schematically shows the conductive line W for electrically connecting the second cathode 122 to the first anode 100 and the conductive line W' for electrically connecting the second cathode 142 to the second anode 120, but the actual setting manners of the conductive line W and the conductive line W' may be changed according to actual requirements.

FIG. 9 schematically shows one of the setting manners of the conductive line W and the conductive line W'. Please refer to FIG. 9. In some embodiments, the top view area of the first semiconductor material layer 104D may be greater than the top view area of the second semiconductor material layer 124F, and the top view area of the second semiconductor material layer 124F may be greater than the top view area of the third semiconductor material layer 144F. In addition, the conductive line W may be disposed on the first semiconductor material layer 104D and the second semiconductor material layer 124F, and is electrically insulated from the first cathode 102 and the second anode 120. The conductive line W' may be disposed on the second semiconductor material layer 124F and the third semiconductor material layer 144F, and is electrically insulated from the second cathode 122 and the third anode 140.

For example, the top view area of the platform portion 104-1 of the first semiconductor material layer 104D may be greater than the top view area of the convex portion 104-2 of the first semiconductor material layer 104D, the top view area of the convex portion 104-2 of the first semiconductor material layer 104D may be greater than the top view area of the platform portion 124-1 of the second semiconductor material layer 124F, the top view area of the platform portion 124-1 of the second semiconductor material layer 124F may be greater than the top view area of the convex portion 124-2' of the second semiconductor material layer 124F, the top view area of the second convex portion 124-2' of the semiconductor material layer 124F may be greater than the top view area of the platform portion 144-1 of the third semiconductor material layer 144F, and the top view area of the platform portion 144-1 of the third semiconductor material layer 144F may be greater than the top view area of the convex portion 144-2 of the third semiconductor material layer 144F. The conductive line W may be disposed on the platform portion 124-1 of the second semiconductor material layer 124F and the convex portion 104-2 of the first semiconductor material layer 104D, and electrically connects the second cathode 122 to the first anode 100, and the conductive line W' may be disposed on the platform portion 144-1 of the third semiconductor material layer 144F and the convex portion 124-2' of the second semiconductor material layer 124F, and electrically connects the second cathode 142 to the second anode 120.

Through the aforementioned control of the voltage difference (please refer to the operation method of the light emitting device structure 1B in FIG. 3), a light emitting region R of the light emitting device structure 1F may also perform full-color display (for example, may output red light, green light, and/or blue light). Reference may be made to the function of the light emitting device structure 1B in FIG. 3 for the function of the light emitting device structure 1F, which will not be repeated here.

Figure 10:
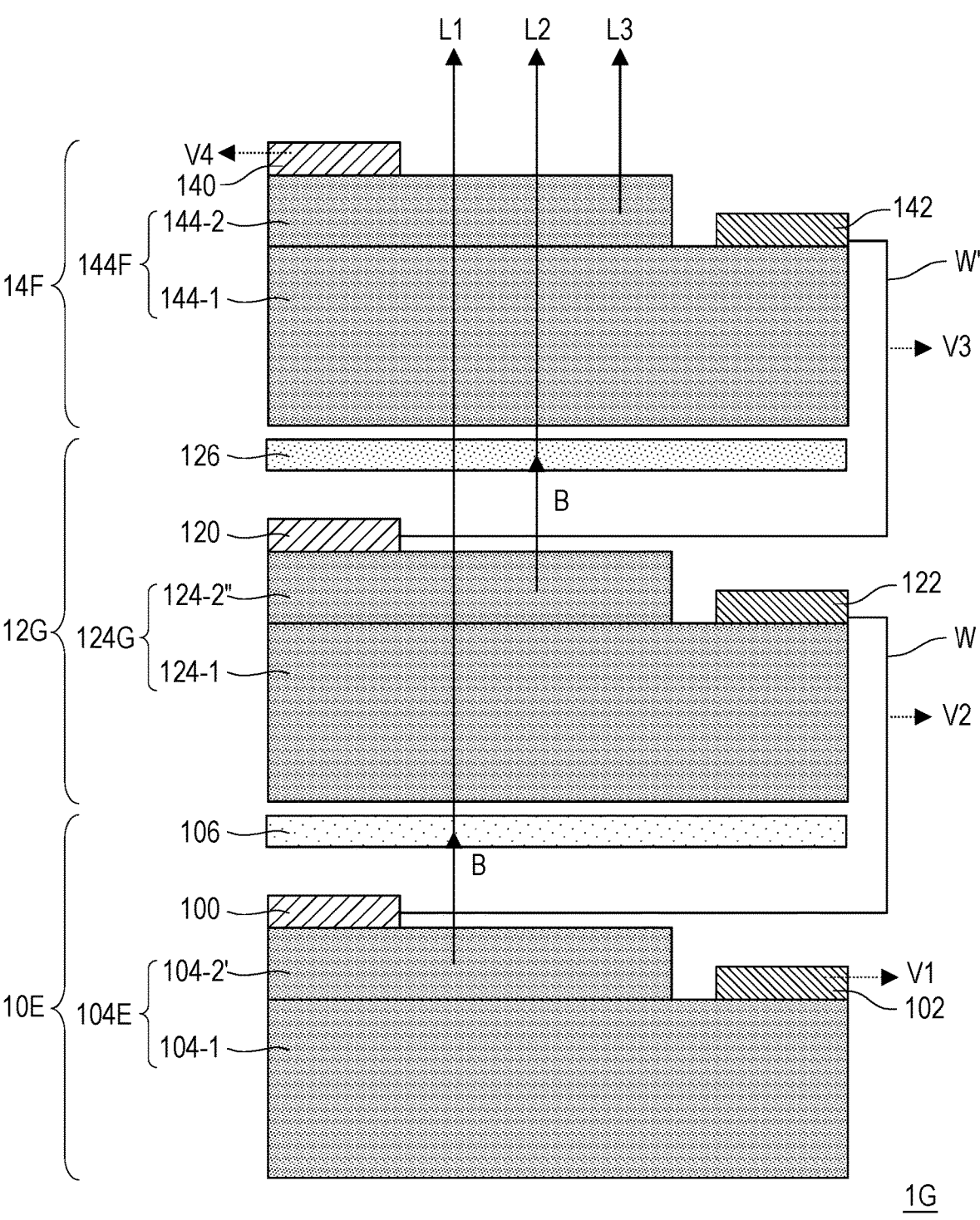

Please refer to FIG. 10. The main difference between a light emitting device structure 1G and the light emitting device structure 1C of FIG. 4 is that the first light emitting element 10E, a second light emitting element 12G, and the third light emitting element 14F in the light emitting device structure 1G are all lateral light emitting diodes, wherein the first anode 100 and the first cathode 102 are disposed on the same side (for example, the light emitting side) of the first semiconductor material layer 104E, the second anode 120 and the second cathode 122 are disposed on the same side (for example, a light emitting side) of a second semiconductor material layer 124G, and the third anode 140 and the third cathode 142 are disposed on the same side (for example, the light emitting side) of the third semiconductor material layer 144F.

Reference may be made to the description related to the first light emitting element 10E in FIG. 7 for details of the first light emitting element 10E, which will not be repeated here. In addition, reference may be made to the description related to the third light emitting element 14F in FIG. 8 for the details of the third light emitting element 14F, which will not be repeated here. The main difference between the second light emitting element 12G and the second light emitting element 12F in FIG. 8 is that the second light emitting element 12G is a combination of a blue light emitting element (including the second anode 120, the second cathode 122, and the second semiconductor material layer 124G) and the green wavelength conversion layer 126.

The second semiconductor material layer 124G may include the platform portion 124-1 and a convex portion 124-2". Although not shown in FIG. 10, the platform portion 124-1 may include a substrate, a buffer layer, and an N-type doped layer, but not limited thereto. The buffer layer and the N-type doped layer are sequentially stacked on the substrate. The convex portion 124-2" and the second cathode 122 are disposed on the N-type doped layer of the platform portion 124-1 and are separated from each other. The convex portion 124-2" may include a compliance layer, a blue light emitting layer, an electron blocking layer, and a P-type doped layer sequentially stacked on the platform portion 124-1, but not limited thereto. The second anode 120 is disposed on the convex portion 124-2". The blue light B emitted by the blue light emitting layer is converted into the second color light L2 by the green wavelength conversion layer 126.

Reference may be made to the operation method of the light emitting device structure 1C in FIG. 4 for the operation method of the light emitting device structure 1G, which will not be repeated here.

In summary, in the embodiments of the disclosure, independently forming the light emitting elements of different colors, and then stacking the light emitting elements of different colors together to form the light emitting device structure can help to increase the brightness of each color light, reduce process difficulty, or improve yield. In addition, adopting the vertically stacked light emitting device structure can occupy a smaller area, which helps to improve resolution. In addition, connecting the light emitting elements of different colors together in series can help to reduce the number of pins of the light emitting device structure and the corresponding number of external conductive lines, thereby helping to improve the flexibility of circuit layout, simplify the process, reduce the space occupied by the circuit, or improve resolution.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A light emitting device structure, comprising:
a first light emitting element, comprising a first anode and a first cathode; and
a second light emitting element, stacked on the first light emitting element and comprising a second anode and a second cathode, wherein the second cathode is electrically connected to the first anode,
wherein the first light emitting element further comprises a first semiconductor material layer, the first anode and the first cathode are disposed on a same side of the first semiconductor material layer, the second light emitting element further comprises a second semiconductor material layer, and the second anode and the second cathode are disposed on a same side of the second semiconductor material layer,
wherein the second cathode is electrically connected to the first anode through a conductive line, and the conductive line is disposed on the first semiconductor material layer and the second semiconductor material layer, and is electrically insulated from the first cathode and the second anode.

2. The light emitting device structure according to claim 1, wherein the first light emitting element is a single-color light emitting element, and the second light emitting element is a double-color light emitting element.

3. The light emitting device structure according to claim 2, wherein the single-color light emitting element is a red light emitting element, and the double-color light emitting element is a green-blue light emitting element.

4. The light emitting device structure according to claim 2, wherein the single-color light emitting element is a combination of a blue light emitting element and a red wavelength conversion layer, and the double-color light emitting element is a green-blue light emitting element.

5. The light emitting device structure according to claim 1, further comprising:

a third light emitting element, stacked on the second light emitting element and comprising a third anode and a third cathode, wherein the third cathode is electrically connected to the second anode, and the first light emitting element, the second light emitting element, and the third light emitting element are all single-color light emitting elements.

6. The light emitting device structure according to claim 5, wherein the first light emitting element is a combination of a blue light emitting element and a red wavelength conversion layer or a red light emitting element, and the second light emitting element is a combination of a blue light emitting element and a green wavelength conversion layer or a green light emitting element, and the third light emitting element is a blue light emitting element.

7. The light emitting device structure according to claim 1, wherein a top view area of the first semiconductor material layer is greater than a top view area of the second semiconductor material layer.

8. An operation method of a light emitting device structure, comprising:

providing a light emitting device structure, wherein the light emitting device structure comprises:

a first light emitting element, comprising a first anode and a first cathode; and a second light emitting element, stacked on the first light emitting element and comprising a second anode and a second cathode, wherein the second cathode is electrically connected to the first anode, wherein the first light emitting element further comprises a first semiconductor material layer, the first anode and the first cathode are disposed on a same side of the first semiconductor material layer, the second light emitting element further comprises a second semiconductor material layer, and the second anode and the second cathode are disposed on a same side of the second semiconductor material layer, wherein the second cathode is electrically connected to the first anode through a conductive line, and the conductive line is disposed on the first semiconductor material layer and the second semiconductor material layer, and is electrically insulated from the first cathode and the second anode;

enabling a voltage difference between the first anode and the first cathode to be greater than a first value, so that the first light emitting element emits a first color light; and enabling a voltage difference between the second anode and the second cathode to be greater than a second value, so that the second light emitting element emits a second color light, wherein the second color light is different from the first color light.

9. The operation method of the light emitting device structure according to claim 8, further comprising:

enabling the voltage difference between the second anode and the second cathode to be greater than a third value, so that the second light emitting element emits a third color light, wherein the third color light, the second color light, and the first color light are different color lights.

10. The operation method of the light emitting device structure according to claim 9, wherein the first light emitting element is a red light emitting element, and the first value is different from the third value.

11. The operation method of the light emitting device structure according to claim 9, wherein the first light emitting element is a combination of a blue light emitting element and a red wavelength conversion layer, and the first value is the same as the third value.

12. The operation method of the light emitting device structure according to claim 8, wherein the light emitting device structure further comprises:

a third light emitting element, stacked on the second light emitting element and comprising a third anode and a third cathode, wherein the third cathode is electrically connected to the second anode, and the operation method of the light emitting device structure further comprises:

enabling a voltage difference between the third anode and the third cathode to be greater than a third value, so that the third light emitting element emits a third color light.

13. The operation method of the light emitting device structure according to claim 12, wherein the first light emitting element is a red light emitting element, and the first value is different from the third value.

14. The operation method of the light emitting device structure according to claim 12, wherein the first light emitting element is a combination of a blue light emitting element and a red wavelength conversion layer, and the first value is the same as the third value.

15. The operation method of the light emitting device structure according to claim 12, wherein the second light emitting element is a green light emitting element, and the second value is different from the third value.

16. The operation method of the light emitting device structure according to claim 12, wherein the second light emitting element is a combination of a blue light emitting element and a green wavelength conversion layer, and the second value is the same as the third value.

* * * * *